United States Patent [19]
Razon et al.

[11] Patent Number: 5,890,643
[45] Date of Patent: Apr. 6, 1999

[54] LOW MASS ULTRASONIC BONDING TOOL

[75] Inventors: Eli Razon, Maple Glen; Avner Guez, Dresher, both of Pa.

[73] Assignee: Kulicke and Soffa Investments, Inc., Wilmington, Del.

[21] Appl. No.: 752,004

[22] Filed: Nov. 15, 1996

[51] Int. Cl.[6] .................................................. B23K 20/10
[52] U.S. Cl. ............................ 228/1.1; 228/4.5; 310/323
[58] Field of Search ........................ 228/1.1, 4.5, 110.1, 228/180.5; 310/321, 323; 156/73.2, 580.1

[56] References Cited

U.S. PATENT DOCUMENTS

| | | | |
|---|---|---|---|
| 5,465,259 | 11/1995 | Barlow et al. | 128/662.03 |
| 5,563,973 | 10/1996 | Miller et al. | 385/81 |
| 5,702,049 | 12/1997 | Biggs et al. | 228/4.5 |

*Primary Examiner*—Samuel M. Heinrich
*Attorney, Agent, or Firm*—John B. Sowell

[57] ABSTRACT

A novel low mass transducer for bonding machines comprises a transducer generator which mounts on or is coupled to a bonding tool of the type used for ball bonding, wedge bonding and TAB bonding. The preferred embodiment transducer comprises a magnetostrictive or piezoelectric element which mount on the outside surface of the bonding tools used in a bonding operation, thus eliminating conventional transducers which also serve as a bonding tool holder. The present invention bonding tool serves as the base or mount for a transducer made in the form of a sleeve or tube which mounts on or couples to the bonding tool. The novel transducer/bonding tool or transducers also serve as a sensor which can monitor the quality of a bond while it is being made.

18 Claims, 8 Drawing Sheets

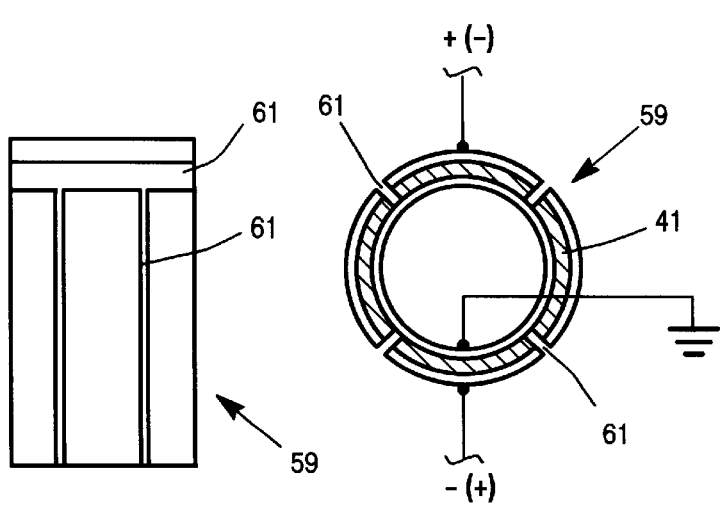
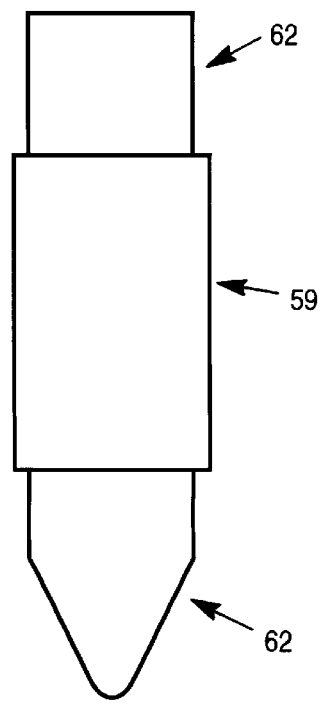
Fig. 12  Fig. 13  Fig. 14
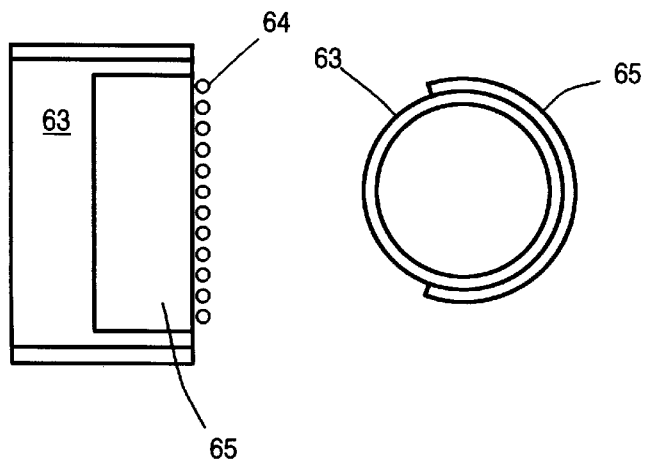
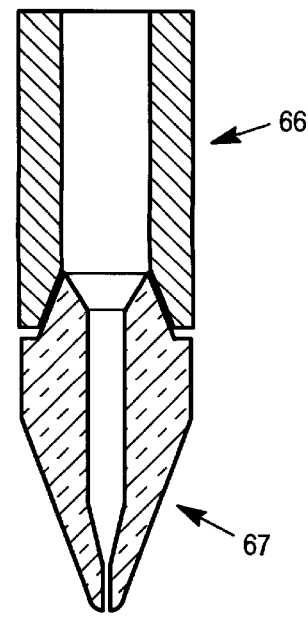
Fig. 15  Fig. 16  Fig. 17

LOW MASS ULTRASONIC BONDING TOOL

BACKGROUND OF THE INVENTION

1. Field of the Invention

The present invention relates to bonding tools for fine wire bonders. More particularly, the present invention relates to a novel ultrasonic transducer or sensor which is coupled to a fine wire bonding tool for use in a fine wire bonding machine.

2. Description of the Prior Art

Automatic wire bonders are well known and are used to make fine wire interconnections between a pad (or electrode) on a semiconductor device to a lead on a lead frame (or carrier). The bonding tools used in such machines are generally referred to as capillaries, used for ball bonding, or wedges used for wedge bonding. Both types of tools are most commonly mounted in ultrasonic transducers which assist in a scrubbing action while making bonds to the pads or leads to effect consistent bonds faster than if no ultrasonic assist had been used.

The bonding heads used to hold the prior art type transducers are quite heavy because they usually include wire clamps and a motor for effecting vertical or Z-motion of the bonding tool. Typical prior art bonding heads for bonding machines are shown in U.S. Pat. Nos. 4,653,681 and 5,360,155 which are incorporated herein by reference. The latter referenced patent employs a miniature piezoelectric vibrator element mounted in a miniature bonding arm which holds a conventional capillary. This piezoelectric element alone weighs three grams and it is estimated that the mounting arm weighs in excess of 30 grams. The bonding head system is mounted on an X-Y table which includes a mechanical actuating system that may weight several kilograms.

These prior art referenced bonding heads impose a large mass on the X-Y positioning motors, which in turn limits fast positioning of the bonding tool. It would be desirable to eliminate components which represent mass that is imposed on the X, Y and Z drive motors so that positioning of the bonding tool may be made faster with greater accuracy and less tendency of overshoot.

It would be desirable to provide a low mass transducer for bonding tools which permits faster positioning as well as lowering the mass of the bonding head components in a bonding machine.

SUMMARY OF THE INVENTION

It is a primary object of the present invention to provide a novel ultrasonic bonding tool.

It is a primary object of the present invention to provide a sleeve or tube shaped ultrasonic transducer which is mounted on and/or coupled to a bonding tool which has a conventional working face.

It is another primary object of the present invention to eliminate the need for a conventional transducer horn or body in a bonding machine.

It is another primary object of the present invention to provide a bonding tool transducer that is programmable for movement in a desired predetermined pattern in a X-Y plane.

It is another primary object of the present invention to provide a bonding tool sensor/transducer that is capable of monitoring bonding tool movement whether induced by external stimulus or by the bonding tool transducer performing a bonding operation.

It is a general object of the present invention to provide a novel bonding tool transducer that has a high characteristic impedance at resonance which remains substantially constant under various load conditions.

It is another principal object of the present invention to provide a novel tab bonding tool.

It is yet another general object of the present invention to provide a tube shaped transducer for mounting on, coupling to or for integrating with a bonding tool.

It is yet another general object of the present invention to provide a method and apparatus for simultaneously making wire bonds and monitoring the progress and quality of the bond.

According to these and other objects of the present invention, there is provided a low mass wire bonding tool in the form of a wedge or capillary. A cylindrical sleeve or annular ring of electromagnetostrictive or piezoelectric material is integrated with or onto the wire bonding tool to form a transducer driver therewith. When individual elements of the transducer driver are energized in a predetermined time sequence, the tip of the bonding tool is moved in predetermined scrub pattern in a resonance mode of movement.

BRIEF DESCRIPTION OF THE DRAWINGS

FIG. 12 is a side elevation of a cylindrical sleeve transducer showing plural sectors;

FIG. 13 is a top view of a modified cylindrical sleeve transducer showing the piezoelectric sectors separated from each other;

FIG. 14 is a side view of a bonding tool having a cylindrical sleeve transducer bonded thereto;

FIG. 15 is a side view of an electromagnetostrictive cylindrical sleeve of the type mountable on any of the previously described bonding tools;

FIG. 16 is a plan view of the sleeve shown in FIG. 15;

FIG. 17 is a diagrammatic side view in section of a transducer sleeve of the types previously described modified to provide a reusable sleeve type transducer for holding a replaceable and disposable bonding tool nib;

DESCRIPTION OF THE PREFERRED EMBODIMENTS

Figure 1:
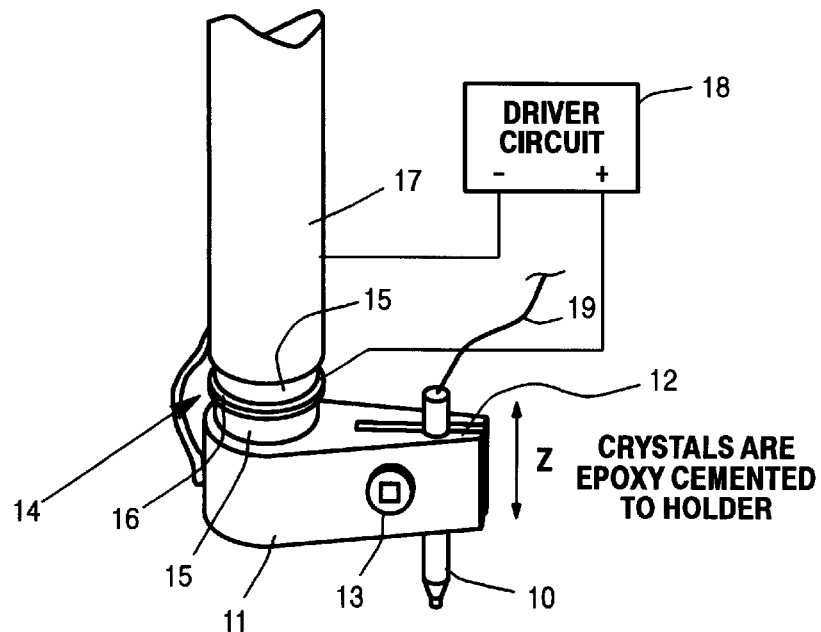
FIG. 1 is an isometric drawing of a prior art bonding tool holder showing a piezoelectric crystal vibrator mounted in series between a mounting arm and a bonding tool holder.

Refer now to FIG. 1 showing a prior art vibrator which is described in U.S. Pat. No. 3,789,183. Bonding tool 10 is mounted in a bonding tool holder 11 and clamped in a split groove 12 by screw 13. A piezo electric driver 14 comprising two crystals 15 are cemented by epoxy cement to positive electrode 16 and to the ends of tool holder 11 and mounting arm 17 which are coupled to the negative output of driver circuit 18. This device was described as being capable of bonding plastic insulated wires to a substrate (not shown). Ultrasonic frequency applied by driver circuit 18 was effective to reduce the bonding force needed in the Z-axis when the bonding tool was vibrated in the Z direction as shown.

Figure 2:
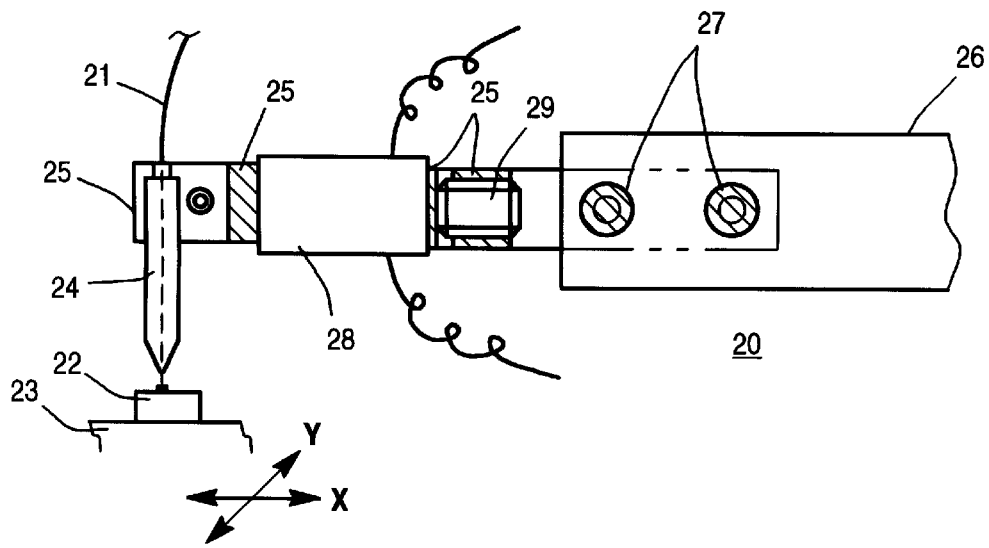
FIG. 2 is a side elevation view of a prior art bonding tool arm that is provided with a bonding tool holder portion and a piezoelectric vibrator element mounted in the bonding tool arm.

Refer now to FIG. 2 showing a prior art wire bonding apparatus 20 for bonding gold wire 21 to a substrate 22 mounted on an X-Y table 23. The capillary bonding tool 24 is shown mounted in a bonding tool arm 25 supported on a lifter arm 26 by screws 27. A feature of apparatus 20 described in U.S. Pat. No. 5,275,324 is that the piezo electric element 28 is mounted in arm 25 (shown sectioned) is held in a compression mode by screw 29 threaded in arm 25 in near proximity to the bonding tool 24. It is explained in this patent that when the capillary 24 is near the piezo electric element 28, vibrational energy loss is minimal and a desirable scrubbing motion can be effected in one horizontal axis direction.

Neither of the aforementioned prior art apparatus are described as capable of being driven into a resonance mode, where the peak amplification of the anti node of a transducer takes place. Thus, as will be explained hereinafter, the present invention will be described as providing a transducer driver physically coupled or mounted on the bonding tool where no energy loss can occur and where the low mass of the capillary bonding tool is driven into a resonance frequency mode even though the driver is not precompressed as usually required to effect resonance.

Figure 3:
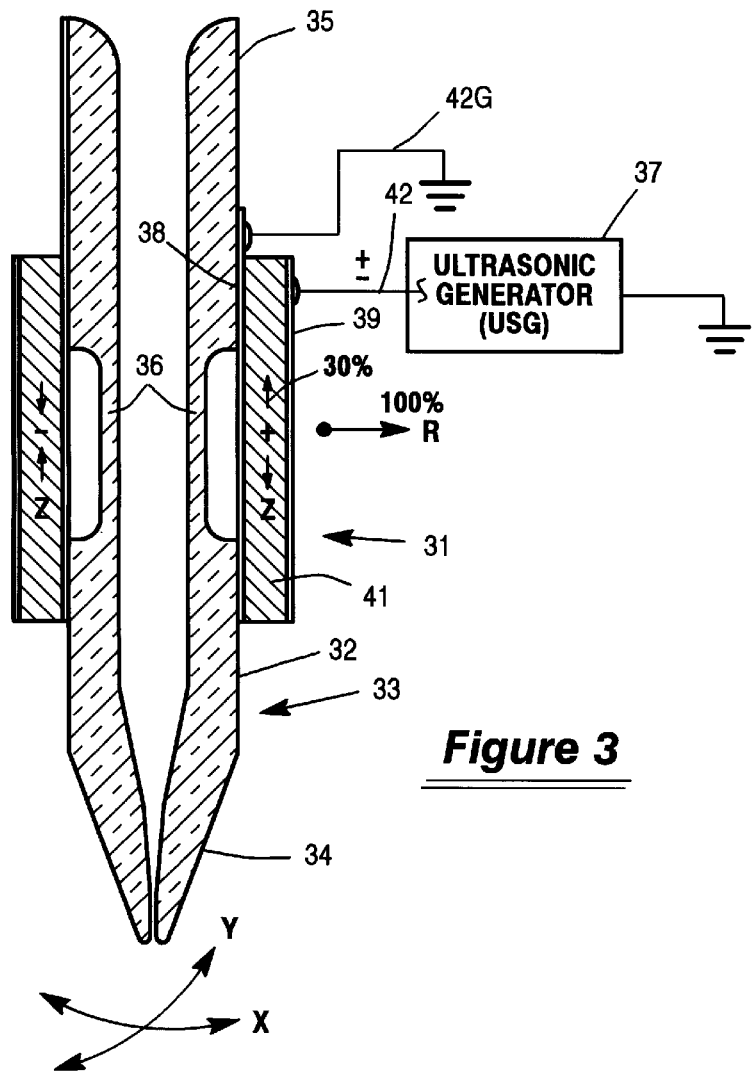
FIG. 3 is an enlarged section in elevation of a preferred embodiment wire bonding tool having a cylindrical sleeve transducer driver coupled to the outside body surface of the bonding tool.

Refer now to FIG. 3 showing an enlarged section in elevation of a preferred embodiment wire bonding tool 33 having a cylindrical sleeve transducer driver 31 coupled to the outside body surface 32 of the capillary bonding tool 33. The standard shaped tool 33 is shown having material removed leaving a thin annular ring 36 which is more flexible than the standard body 33.

When the ultrasonic generator 37 (USG) applies an alternating signal to the inner and outer electrodes 38, 39 of the piezo electrical crystal(s) 41, they are excited and tend to expand and contract radially and axially as shown by the arrows.

The crystals may be oriented during manufacture to have greater expansion in the vertical or Z direction or radically (R). The crystals also expand in a direction transverse to the axis of orientation. It has been found that when the crystals are oriented for radial expansion, the Z axis expansion is still sufficient to cause the working face of bonding tool to move in a desired X and Y pattern.

Figure 4:
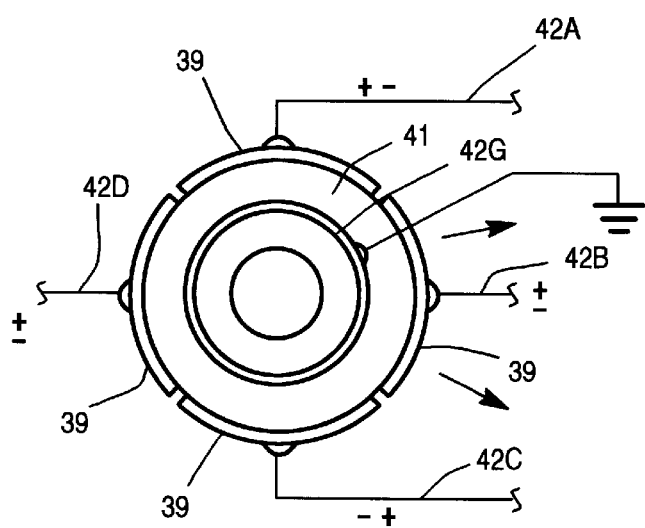
FIG. 4 is a plan view in section of the FIG. 3 bonding tool showing four segmented electrode drivers.

Refer now to FIG. 4 showing a plan view in section of the bonding tool 33 shown in FIG. 3. The four outer electrodes 39 are separated from each other and form four strips or segments each of which is coupled to the U.S. generator 37 by individual leads 42A to 42D. The generator 37 is capable of programmable driving the four sets of crystal drivers defined the electrodes 42A to D and inner electrode 42G so that the pattern of the working face end 34 is also programmable.

Figure 5:
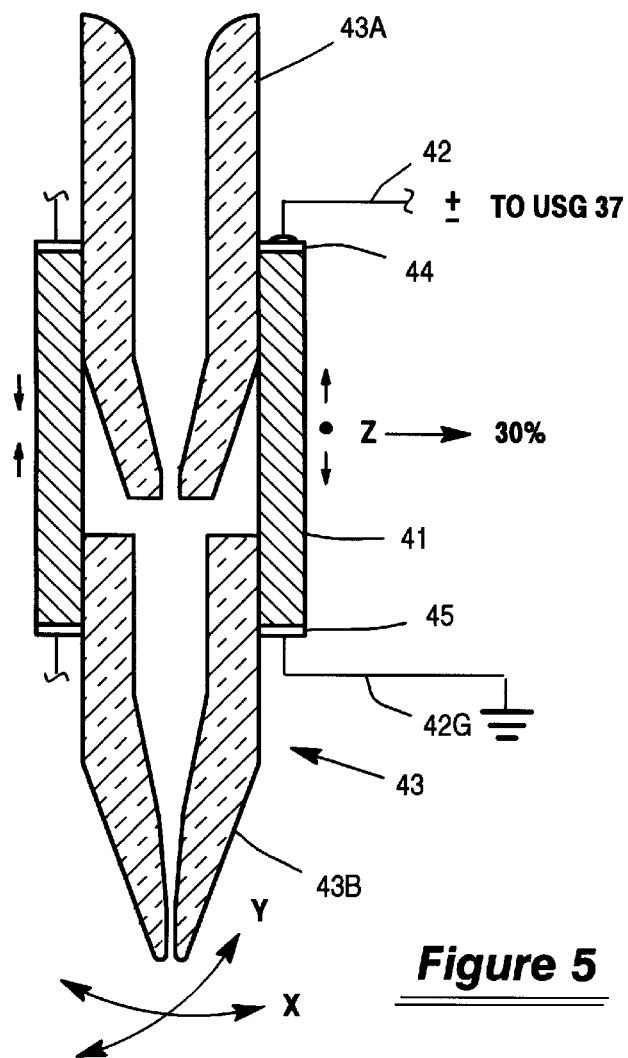
FIG. 5 is an enlarged section in elevation of another preferred embodiment wire bonding tool having a cylindrical sleeve transducer driver coupled to the outside body surface of a composite bonding tool.

Refer now to FIG. 5 showing an enlarge section in elevation of a two piece bonding tool 43. Upper tool portion 43A serves as a wire guide as well as provides means for clamping the tool body in a tool holder. Lower tool portion 43B is a wire bonding nib having a standard working face on the tapered end. In this embodiment the crystal 41 are oriented in the Z direction and electrodes 44 and 45 are connected at the upper and lower ends of the cylindrical sleeve transducer. Leads 42 connect electrodes 44A to D and 45A to D to the US Generator 37 as will be explained.

Figure 6:
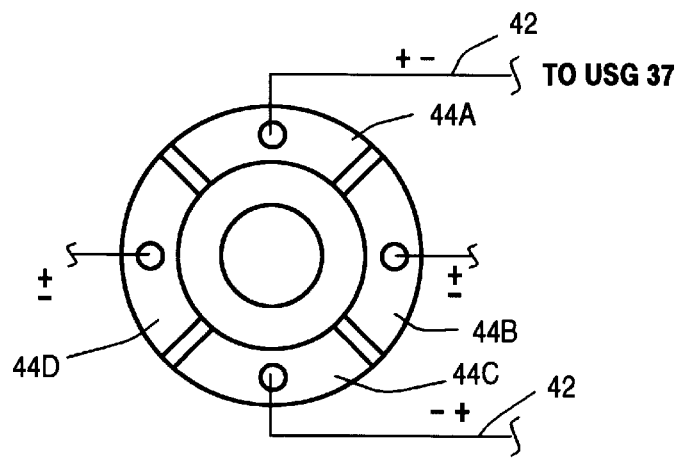
FIG. 6 is a plan view of the FIG. 5 bonding tool showing four segmented electrodes.

Refer now to FIG. 6 showing the bonding tool 43 in plan view. It will be understood that upper electrodes 44A to 44D shown are positioned on the cylindrical crystal sleeve 41 direct above lower electrodes 45A to 45D respectively and form strips or sectors which are operable as individual transducers under control of U.S. Generator 37 which includes a programmable controller.

In this embodiment the electrodes 45A to D were grounded at leads 45G but could be controlled individually by USG 37. The advantage observed with this preferred embodiment cylindrical sleeve transducer is that the crystals 41 were oriented in the Z direction as shown by the arrows. Thus, the X and Y pattern of the working face of tool 43 was greater and could be achieved at lessor power. Further, since the bonding tool 43 is made in two parts with no flexible annular ring at the center. There is less tendency to fracture the bonding tool before the working face is completely worn out.

Figure 7:
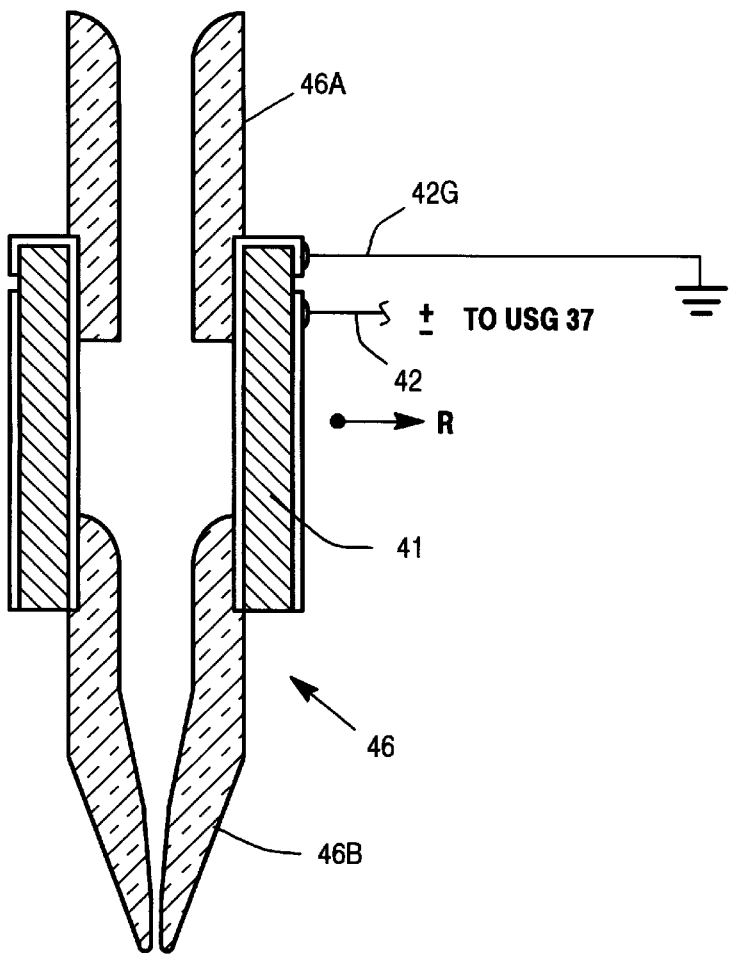
FIG. 7 is an enlarged section in elevation of a modified wire bonding tool having a cylindrical sleeve transducer driver coupled to the outside body surface of a composite bonding tool.
Figure 8:
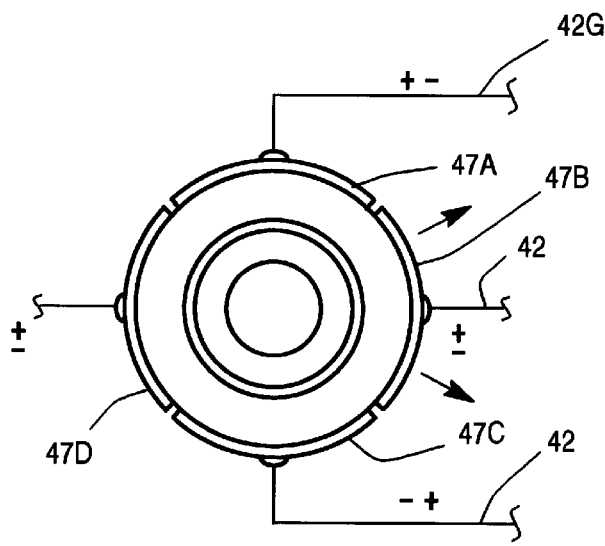
FIG. 8 is a plan view of FIG. 7 bonding tool showing four segmental electrodes.

Refer now to FIGS. 7 and 8 showing a further modified embodiment having a two piece bonding tool 46, 46A, 46B similar to the FIGS. 5, 6 embodiment. The same numerals used in FIGS. 5 and 6 are used in FIGS. 7 and 8 and the operation is identical and does not require a detailed explanation. In this embodiment the crystals in the cylindrical sleeve are oriented in the radial (R) direction, and the sectors are defined by the electrodes 47A to 47D shown in section. The center electrode 42G is a continuous cylinder which is preferably grounded. The expanding and contracting crystals cause Z motion which translates into X-Y movements of the tip 46B.

Figure 9:
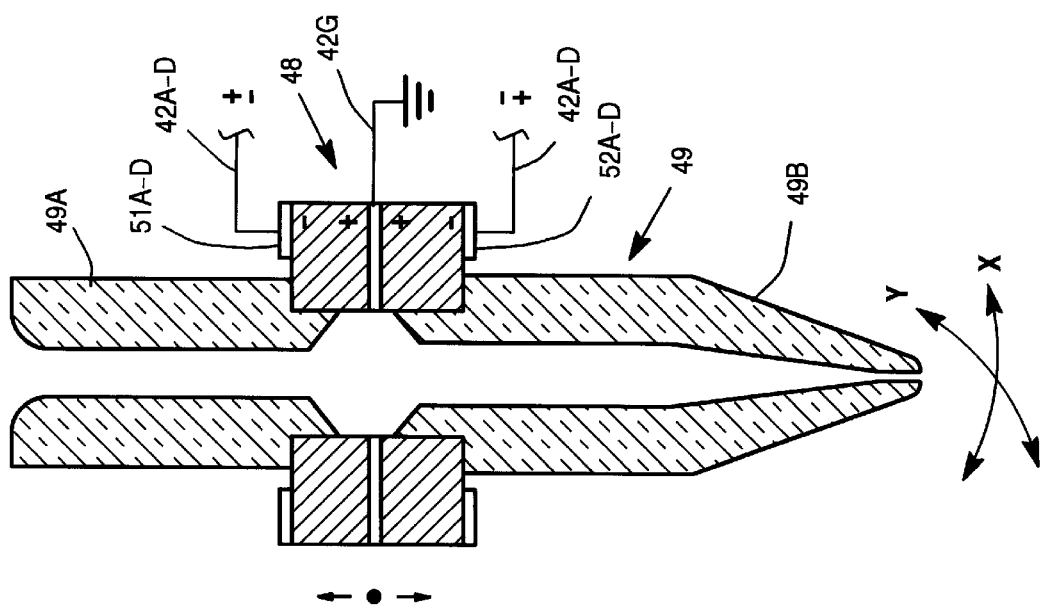
FIG. 9 is an enlarged section in elevation showing an annular ring transducer driver coupled to a composite bonding tool.

Refer now to FIG. 9 showing another modified two piece bonding tool in section and in elevation. An annular ring of crystal elements 48 form a transducer with the bonding tool elements 49A and 49B. The electrodes 51A to D and 52A to D are formed as segments of an annular ring and are individually controlled by lines 42A to D as explained hereinbefore. It has been found that manufacturing the cylindrical sleeve transducer in the form of an annular ring has some manufacturing advantages. The crystal elements are more easily assembled and oriented and can more easily be cemented to the bonding tool elements 49A and 49B.

Figure 10:
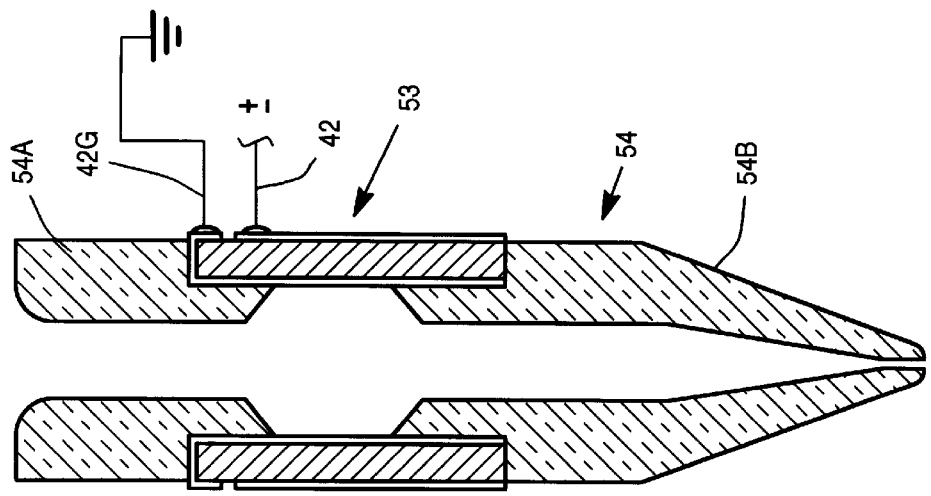
FIG. 10 is an enlarged section in elevation showing a cylindrical sleeve transducer driver coupled to a modified composite bonding tool.

Refer now to FIG. 10 showing a cylindrical sleeve 53 mounted on a wire bonding tool 54 which is substantially identical to the two piece bonding tool 49 shown in FIG. 9. This bonding tool 54 is shown diagrammatically and it will be understood that the crystals in the cylindrical sleeve as well as the number, size and pattern of the electrodes thereon may be such that any desired pattern of movement of the working face of bonding tool end 54B can be achieved.

Figure 11:
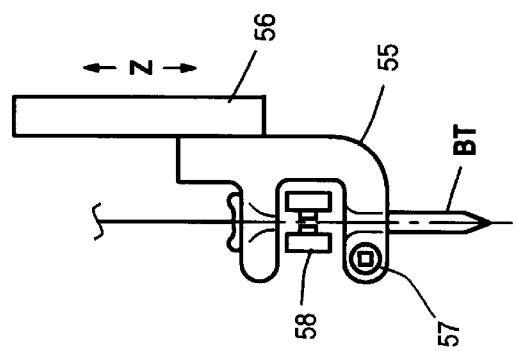
FIG. 11 is a side elevation of a miniature bonding tool holder having a pair of miniature wire clamps positioned above the novel bonding tool. A linear Z-slider element is diagrammatically shown for effecting Z-axis movement.

Refer now to FIG. 11 showing a side elevation of a miniature bonding tool holder 55 supported on a Z slider 56. The bonding tool BT shown clamped in a split holder may take any of the forms previously described or have variations of the individual features. A low mass wire clamp 58 is shown positioned over the transducer/capillary BT and is preferably supported on an extension mounted on the bonding tool holder 55 (not shown).

Refer now to FIG. 12 showing a cylindrical sleeve transducer 59 in side elevation and to FIG. 13 showing a plan view of transducer 59. This embodiment show diagrammatically the simplicity of making novel cylindrical sleeve transducers 59. In the preferred method of making the transducer, a sleeve of piezo electric crystals are compressed and fired and if necessary machined and/or ground to a final shape and size. The inner electrode and the outer electrodes are then added. The pattern which separates transducer elements may be made in several ways, by using photo resist technology, grinding or machining separation streets 61 or be evaporating the electrode material to be removed with a laser of the type used to trim resistors and capacitors on substrates or circuit boards. As shown in FIG. 13 it is possible to cut the streets 61 through or partially through the crystal material 41. The last step(s) is to orient the crystals in a preferred direction. The Z direction of orientation offers the maximum excursion of the working face of the bonding tool by bending the sleeve 59. A radial orientation of crystals causes bending also causes bending and is operable. It would appear that individual segmented transducers could be assembled onto an inner electrode sleeve, however, it was found that a stiff inner electrode was needed on which to assemble individual transducer elements 41. Making the sleeve and defining the sheets simultaneously or sequentially is cheaper and more repeatable in manufacture.

Refer now to FIG. 14 showing a cylindrical sleeve transducer bonded to a one piece or two piece bonding tool 62. In the preferred embodiment shown, the sleeve 59 was manufactured to a precise inner and outer diameter. The bonding tool 62 was centerless ground on the outside surface to provide an accurate outside diameter. The elements (two or three) were then assembled using high strength epoxy adhesives.

Refer now to FIG. 15 showing a cylindrical sleeve transducer 63 made from an open sleeve of magnetostrictive material 65 such as TUFELON D which is a ceramic oxide. This material expands and contracts like piezoelectric crystals in the presence of an induced magnetic field shown schematically by coils 64.

Refer also to FIG. 16 showing a plan view of the cylindrical sleeve transducer shown in FIG. 15. In this embodiment a single outer electrode 65 is shown covering about half of the outer surface of sleeve 63. The magnetostrictive material 65 causes the sleeve to bend, however, if the electrode 65 is extended to surround the sleeve 63 the bonding tool nib would oscillate in a Z direction which is the preferred mode when making TAB bonds in a tape automated bonding (TAB) machine where a flexible finger or lead is employed in the place of fine wire. Any of the former embodiments may be employed for TAB bonding tools.

Refer now to FIG. 17 showing an enlarged elevation in section of one of the preferred embodiment cylindrical sleeve transducers 66 which also serves as a holder for a replaceable bonding tool nib 67.

It will be appreciated that the cylindrical sleeve previously described were bonded to a bonding tool body. Since such bonding tool are usually worn out during a single work day, it was found to be economically feasible to rework the working face end of the bonding tool.

It is cheaper yet to only replace the nib 67 and continue to use the transducer sleeve 66 over a longer time period.

Figure 18:
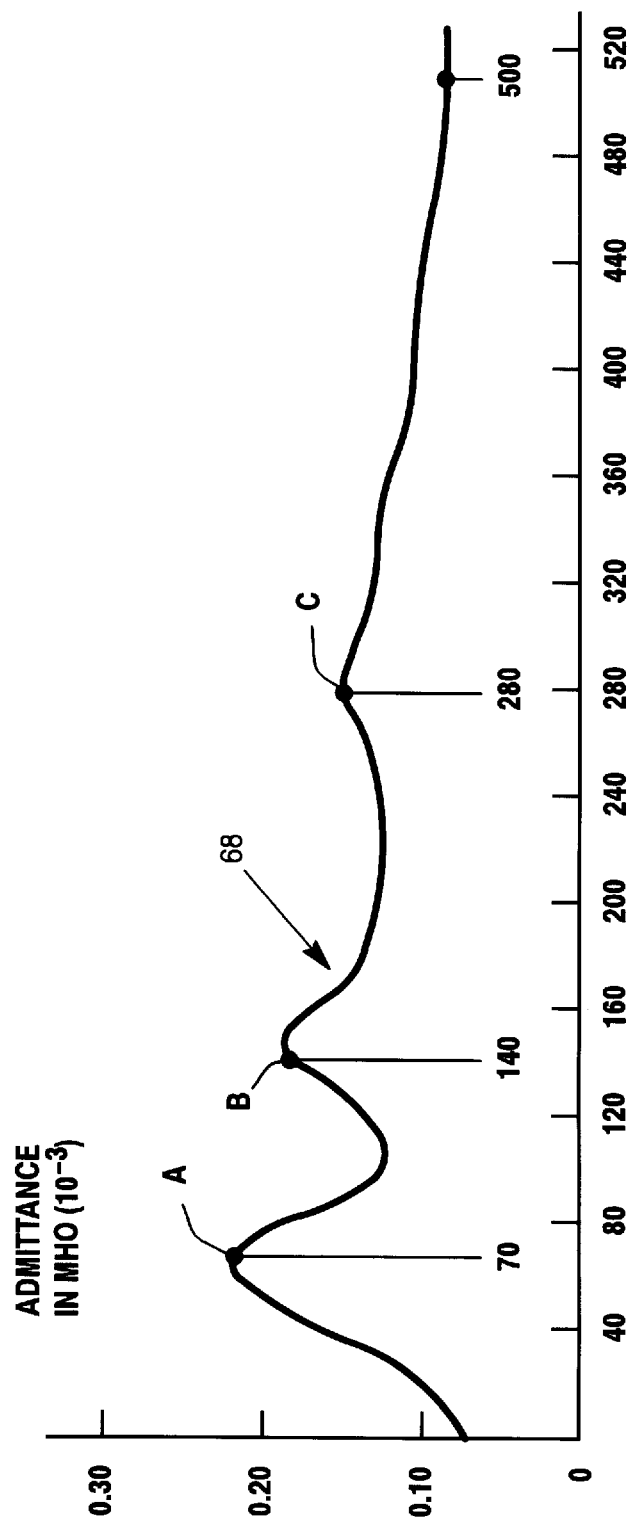
FIG. 18 is a waveform of admittance versus frequency in kilohertz showing a plurality of usable resonance frequencies achieved with the present invention sleeve type transducer.

Refer now to FIG. 18 showing a waveform 68 obtained from a typical piezoelectric cylindrical sleeve bonding tool. The waveform 68 shows peaks in the values of admittance in Mhos·$10^{-3}$ at resonance peaks A, B and C which occurred at frequencies of approximately 70, 140 and 280 kilohertz. All of the frequencies are desirable and usable for wire bonding and/for TAB bonding.

Prior art horn shaped transducers of the type currently in use have a characteristic impedance Z of less than 100 ohms. The present invention transducer/capillary is shown to have a characteristic impedance of five thousand ohms. Other cylindrical sleeve transducers were measured to have a $Z_o$=3000–5000 ohms. The advantage to this high impedance is that the impedance shift under load conditions is negligible and driving currents are now easily controlled.

Figure 19:
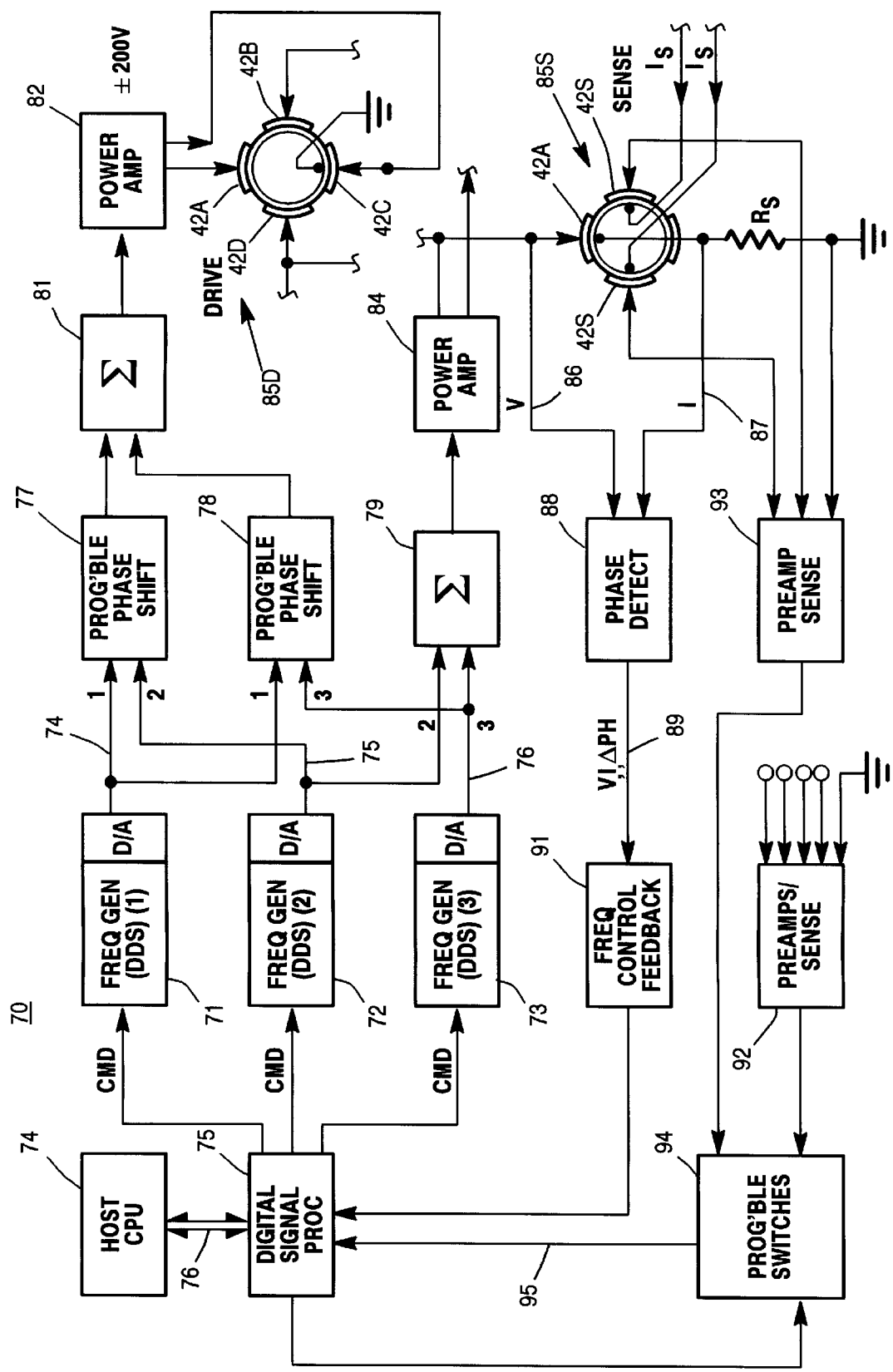
FIG. 19 is a block diagram of a sensing circuit and a programmable multi-frequency ultrasonic generator capable of driving the aforementioned novel transducers.

Refer now to FIG. 19 showing a block diagram of a programmable multi-frequency ultrasonic generator capable of driving the transducers described hereinbefore. USG 70 comprises a plurality of frequency generators 71, 72, 73, etc. which may be controlled by a micro processor driven independent controller or by a Host CPU 74 which is available in all wire bonding and TAB bonding machines. Preferably a digital signal processor 75 is employed to speed up control operations and is connected thereto by a bus 76 and interface ports. The host computer initiates operation and the digital signal processor issues digital commands to the digital signal synthesizers (DDS) in generators 71–73 to produce desired digital frequencies which are converted to analog signals on lines 74–76. The analog signal may be phase shifted in programmable phase shifters 77, 78 or passed through summing circuit 79 without a shift. The signals to be applied to an opposing pair of electrodes are summed in summary circuit 81, then amplified at high voltage/low current amplifier 82 before being coupled to a pair of outer electrodes 42A and 42C. A similar circuit and power amplifier 84 independently controls electrodes 42B and 42D. In effect there are four transducers which are preferably controlled in phase opposition to effect maximum bending of the cylindrical sleeve drive transducer 85D.

The same transducer 85D or a sense transducer 85S is shown connected to the USG 70. The output of power amplifier 84 is shown connected across one of the individual transducers at 42A. The driving current is passed through sensing resistor $R_S$ so that the voltage and current may be sensed on lines 86 and 87. The resonance frequency of the transducer at 42A sifts under load and is sensed as a phase shift in detector 88. A phase error signal generated on line 89 is employed in the feedback control 91 which supplies the processor 75 with control data employed to issue new command signal CMDs to generators 71, 72 and 73 in the form of a closed feedback loop.

The transducers of the present invention are also sensors which may be operated in a sensing mode. As an example, transducer sensor 85S is provided with a pair of sensors 42S. The change in current flow Is across sensors 42S are applied to sensing amplifiers 92 or 93.

The output of the sensors are scanned at programmable switching means 94. The sensed values of individual sensors 42S are coupled back to processor 75 via line 95 and are employed for monitoring the value of impedance sensed which is indicative of a completed good bond and/or used to control values of voltage current and power to effect good bonds. The sensed values of good bonds are always updated and improved with data obtained during set up of operations.

Having explained a multi frequency generator 70 for sensing bonding values, it will be appreciated that the values may be sensed concurrently with actual wire bonding or TAB bonding operation. Thus, the values sensed may be perceived as analogous to strain gage values used with prior art transducers to monitor bonding force being applied. Since the sensor value sensed in the present invention are indicative of X-Y motion of the working face of the bonding tool a new value and new mode of operation is being sensed which can be used to determine if a bond being made results in an acceptable bond without having to examine the bond in post bond testing.

Having explained that piezoelectric sleeves and or piezoelectric annular rings may be mounted on bonding capillaries or TAB bonding tools it will be understood that the same structures and modifications thereof are also applicable to wedge bonding tool. This new structure permits wedge bonding tools to make first and second bonds or TAB bonds on finer pitch pads and smaller pad sizes than was hereto possible.

While the preferred embodiment invention was explained using bonding capillaries, TAB bonding tools and wedge bonding tools, it will be understood that the novel electromagnetostrictive or piezoelectric transducer sleeves are capable of being employed as a plurality of transducers to effect a preferred scrubbing pattern or to be used concurrently to detect as a sensor whether that preferred pattern was executed. The collecting and analysis of the sensed data is not treated in detail herein.

The novel transducer/sensor explained herein is within the scope of the claims which follow.

What is claimed is:

1. A low mass transducer for wire bonding machines, comprising:
    a wire bonding tool of the type having a working face on one end for bonding a fine wire to a semiconductor device,
    said wire bonding tool having an attachment end opposite the working face end for clamping into a tool holder,
    a transducer mounted on the outside surface of said wire bonding tool between said working face end and said attachment end, and
    means for electronically connecting a source of ultrasonic energy to said transducer generator on said wire bonding tool.

2. A low mass transducer as set forth in claim 1 wherein said transducer generator comprises a sleeve of piezo electric material having first and second conductive electrode means, and
    said piezoelectric material being sandwiched between said electrode means.

3. A low mass transducer as set forth in claim 2 wherein said first conductive electrode means comprises a plurality of individual outer electrodes.

4. A low mass transducer as set forth in claim 3 wherein said second conductive electrode means comprises an inner conductive cylinder.

5. A low mass transducer as set forth in claim 3 wherein said outer electrodes comprise vertical strips of conductive material separated by vertical grooves or streets.

6. A low mass transducer as set forth in claim 4 wherein said inner electrode further includes a cylinder extension for engaging and making electric contact with the tool holder.

7. A low mass transducer as set forth in claim 5 wherein each of said inner and said outer electrodes is coupled to an ultrasonic generator.

8. A low mass transducer as set forth in claim 7 wherein said inner electrode is coupled to a fixed reference voltage potential source and said outer electrodes are coupled to an alternating current potential source of ultrasonic energy.

9. A low mass transducer as set forth in claim 1 wherein said transducer generator comprises a sleeve of piezoelectric material.

10. A low mass transducer as set forth in claim 1 wherein said transducer generator comprises a sleeve of magnetostrictive material.

11. A low mass transducer as set forth in claim 2 wherein said conductive electrode means comprises segments of an annular ring disposal at opposite ends of said sleeve.

12. A low mass transducer for high speed wire bonding machines, comprising:
    a hollow tube shaped transducer body having a vertical axis;
    clamping means arranged on one end of said transducer body,
    receiving means formed on the end of said transducer body opposite said clamping means for coupling a bonding tool nib to said transducer body,
    electrode means on said transducer body for defining a plurality of individual transducers each operable to effect movement of the bonding tool nib in at least said vertical axis.

13. A low mass transducer as set forth in claim 12, wherein said hollow tube comprises a cylinder of electro expansive material, and
    said electrode means comprise areas of conductive material applied to surfaces of said body which define individual transducers between pairs of electrodes.

14. A low mass transducer as set forth in claim 13 wherein said hollow tube comprises a cylinder of magnetostrictive or piezo electric material.

15. A low mass transducer as set forth in claim 14 wherein said hollow tube comprises a plurality of annular rings bonded together to form a stack of individual transducers operable to expand in said vertical axis.

16. A low mass transducer as set forth in claim 12 wherein at least one of said plurality of transducers is operably connectable to a sensing circuit.

17. A low mass transducer/sensor, comprising:
    a hollow tube shaped transducer/sensor body having a vertical axis, clamping means arranged on one end of said transducer body, workpiece engagement means formed on the end of said transducer body opposite said clamping means, electrode means on said transducer/sensor body for defining a plurality of individual transducer/sensors each operable to effect and/or detect bending movement of said transducer/sensor body.

18. A novel low mass transducer comprising:

a capillary shaped bonding tool having a vertical axis, and a bonding tip, a hollow transducer generator bonded to the outside of said capillary shaped bonding tool for imparting a bending motion to the bonding tool and imparting movement of said bonding tip which is orthogonal to said vertical axis.

* * * * *